(12) United States Patent
Gerber

(10) Patent No.: US 6,414,617 B1
(45) Date of Patent: Jul. 2, 2002

(54) DIGITAL-TO-ANALOGUE CONVERTER

(75) Inventor: Rémi Gerber, Nantes (FR)

(73) Assignee: Atmel Nantes SA (FR)

( * ) Notice: Subject to any disclaimer, the term of this patent is extended or adjusted under 35 U.S.C. 154(b) by 0 days.

(21) Appl. No.: 09/856,330

(22) PCT Filed: Sep. 21, 2000

(86) PCT No.: PCT/FR00/02617

§ 371 (c)(1),
(2), (4) Date: May 18, 2001

(87) PCT Pub. No.: WO01/22596

PCT Pub. Date: Mar. 29, 2001

(30) Foreign Application Priority Data

Sep. 22, 1999 (FR) .............................................. 99 11827

(51) Int. Cl.$^7$ ................................................ H03M 1/66
(52) U.S. Cl. ....................................... 341/144; 341/154
(58) Field of Search .................. 341/144, 143, 341/154, 139, 121, 153

(56) References Cited

U.S. PATENT DOCUMENTS 6,154,121 A * 11/2000 Cairns et al. ............... 340/347
6,307,490 B1 * 10/2001 Litfin et al. ................. 341/121

* cited by examiner

Primary Examiner—Peguy JeanPierre
Assistant Examiner—Joseph Lauture
(74) Attorney, Agent, or Firm—Piper Rudnick

(57) ABSTRACT

The invention concerns an analog-to-digital converter, comprising programmable circuits generating (1) an image electric current proportional to the sum of active voltage values forming a series of voltage levels in geometric progression and corresponding to electric voltage values for which the analog image of the bit weight corresponds to a bit of value 1 and first programmable corrector circuits (2) receiving the image electric current and generating a first corrected analog voltage, being the difference between the supply voltage and the weighted sum of the active values. A second corrector circuit (3) of said first voltage generates a second corrected analog voltage substantially equal in quantity and sign to the weighted sum electric voltage active values. Third corrector circuits (4) of the second voltage enable to apply a programmed gain, inversely equal to the weighting term, thereby enabling to generate the converted analog voltage. The invention is useful for producing integrated circuits.

6 Claims, 2 Drawing Sheets

DIGITAL-TO-ANALOGUE CONVERTER

The invention relates to an immediately acting digital-to-analogue converter.

Existing digital-to-analogue converters operate with a conversion time in the order of several hundred nanoseconds due to the existence of analogue circuits, designed to restore the converted analogue voltage by integration.

Solutions have been proposed as a means of reducing this conversion time and consist in reducing the integration capacities. However, these solutions have a limited effect because a reduction of this type is at odds with the very principle of the mode by which these systems operate.

The objective of the present invention is to remedy the disadvantages and limitations of known digital-to-analogue converters by using a digital-to-analogue converter which acts immediately, the response time being no longer than the cumulative switching time of linear amplifier circuit modules.

Another objective of the present invention is to operate an automatically programmable digital-to-analogue converter in which the automatic programming process is directly driven by the digital value to be converted to an analogue value.

The immediately acting digital-to-analogue converter proposed by the present invention enables a digital value to be to be converted, encoded on N bits, to be converted into an analogue voltage with a value ranging between an electric supply voltage Vcc and a reference voltage, being the ground voltage.

It is remarkable in that it comprises at least programmable circuits generating an image electric current proportional to the sum of the active values of electric voltages in a series of N electric voltages constituting a geometric progression of 2 and forming an analogue image of the weight of the bits between the most significant bit and the least significant bit on which the digital value to be converted is coded, the active values corresponding to the values for which the analogue image of the weight of the bits of the digital value to be converted correspond to a bit with a value of 1.

It also comprises first programmable corrector circuits receiving the image electric current and enabling a first programmed, corrected analogue voltage to be generated, proportional to the difference between the supply voltage Vcc and the weighted sum of the active values of electric voltages in the series of electric voltages, the weighting term of the weighted sum being inversely proportional to the number of bits of value 1 of the digital value to be converted, and second corrector circuits receiving the first programmed, corrected analogue voltage and enabling a second programmed, corrected analogue voltage to be generated, substantially equal in value and sign to the weighted sum of the active values of electric voltages in the series of electric voltages.

Finally, it comprises third corrector circuits, receiving the second programmed, corrected analogue voltage and enabling a programmed gain to be applied, equal to the inverse of the weighting term, which enables the analogue voltage between the supply voltage and the reference voltage to be generated, this value being equal to the sum of the active values of electric voltages in the series of electric voltages.

The immediately acting digital-to-analogue converter proposed by the invention finds applications in any field of high-speed electronics such as aeronautical or space electronics, for example for converting audio and/or video digital signals.

It will be more readily understood from the description and by referring to the drawings, of which:

A more detailed description of an immediately acting, auto-programmable digital-to-analogue converter as proposed by the present invention will now be given with reference to the embodiment illustrated in FIG. 1a, which is not restrictive in any respect.

Turning to said drawing, the digital-to-analogue converter receives a digital value to be converted, coded on N bits, the coding bits being denoted by $b_0$ for the least significant bit to $b_{N-1}$ for the most significant bit, the current bit being written $b_j$. The analogue voltage generated is denoted by $V_{OUT}$. The value of this analogue voltage is, by definition, between the electric supply voltage Vcc and a reference voltage, denoted by $V_{REF}$, also referred to as ground voltage.

By virtue of one particularly remarkable feature, the digital-to-analogue converter proposed by the present invention has programmable circuits 1 which generate an image electric current, denoted by $I_i$, proportional to the sum of the active values of electric voltages in a series of N electric voltages constituting a ½ geometric progression. The series of N electric voltages forms an analogue image of the weight of the coding bits of the digital value to be converted between the most significant bit $b_{N-1}$ and the least significant bit $b_0$ on which the digital value to be converted is coded or represented. Generally speaking, the series of N electric voltages constituting a ½ geometric progression preferably verifies equation (1):

$$V_j = Vcc/2^{N-j}.$$

Similarly, the active values correspond to the electric voltage values in the series of electric voltages geometrically progressing by ½, for which the analogue image of the weight of the bits of the digital value to be converted corresponds to a bit with a value 1.

Taking account of the above definition, each electric voltage active value, denoted by $Vx_j$, verifies equation (2):

$$Vx_j = b_j \cdot Vcc/2^{N-j}.$$

It is clear, in particular, that if the value of the bits $b_j$ is equal to 1, the active values of electric voltages are equal to the corresponding value of the analogue image of the bit weight represented by the corresponding electric voltage of the series of N electric voltages constituting the geometric progression, whereas if these bits are zero, the corresponding active value will obviously be equal to zero.

Figure 1A:
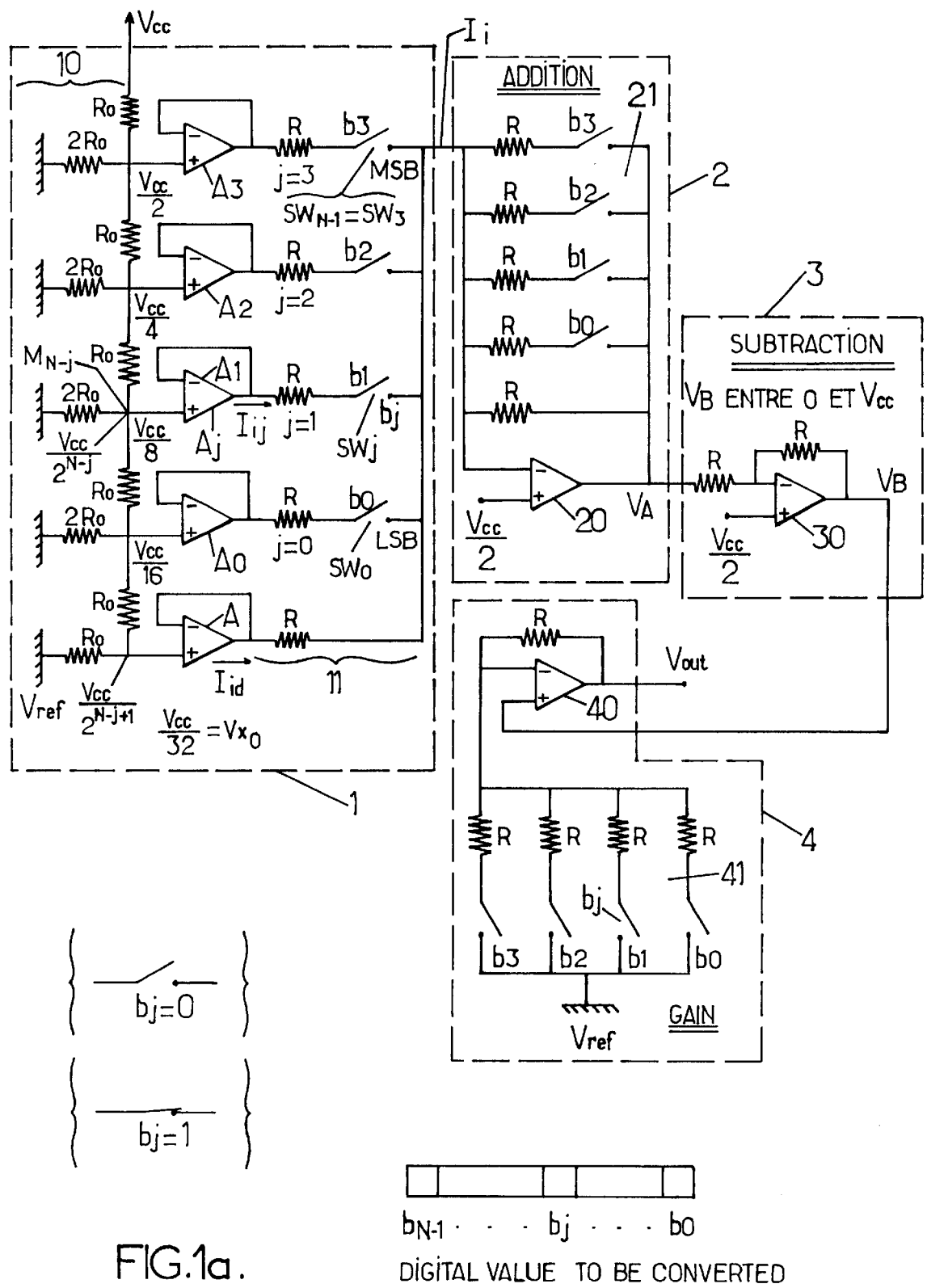
FIG. 1a illustrates a first example, although this is not restrictive, of the digital-to-analogue converter proposed by the present invention.

Furthermore, as illustrated in FIG. 1a, the digital-to-analogue converter proposed by the present invention comprises first programmable corrector circuits 2 receiving the image electric current $I_i$ proportional to the sum of said electric voltage active values, these first circuits 2 enabling a first programmed, corrected analogue voltage to be generated, denoted by $V_A$, proportional to the difference between the supply voltage Vcc and the weighted sum of the active values of electric voltages in the series of electric voltages represented by said image electric current $I_i$. The weighting term of the weighted sum is inversely proportional to the number of bits a having value 1 of the digital value to be converted.

As may be seen from FIG. 1a, the digital-to-analogue converter proposed by the invention additionally comprises second corrector circuits 3, receiving the first programmed, corrected analogue voltage $V_A$ and enabling a second programmed, corrected analogue voltage $V_B$ to be generated, substantially equal in value and sign to the weighted sum of the active values of electric voltages in the series of electric voltages.

Finally, the digital-to-analogue converter proposed by the invention, as illustrated in FIG. 1a, comprises third corrector circuits 4, receiving the second programmed, corrected analogue voltage $V_B$ and enabling a programmed gain equal to the inverse of the weighting term to be applied, these third corrector circuits 4 enabling the analogue voltage $V_{OUT}$ to be generated with a value ranging between the supply voltage Vcc and the reference voltage $V_{REF}$, the value of which is equal to the sum of the active values of electric voltages in the series of electric voltages in accordance with equation (2).

A more detailed description of the various modules making up the digital-to-analogue converter proposed by the present invention will now be given, also with reference to FIG. 1a.

In order to generate the image electric current $I_i$ proportional to the sum of the active values of electric voltages $Vx_j$, a preferred implementing mode may consist in building the programmable generator circuits 1 so that they comprise, as illustrated in FIG. 1a, at least a plurality, shown by reference 10, of N electric voltage divider bridges connected in a cascade arrangement between the supply voltage and the reference voltage. In FIG. 1a, the plurality of divider bridges is shown by bridges $R_0/2R_0$, where $R_0$ denotes a given resistance value. As illustrated in FIG. 1a, the input terminal of the first divider bridge is connected to the supply voltage Vcc, the resistor $2R_0$ being connected to the reference voltage, and the mid-point of this divider bridge constitutes the mid-point $M_{N-3}$ which, for N=4, being the number of bits in this example although this is not restrictive, outputs a first value from the series of N electric voltages in 2 geometrical progression, the value of which is equal to $Vcc/2^1$ if j=3.

Similarly, the second divider bridge consists of a bridge $R_0/2R_0$, the input of the divider bridge via the resistor $R_0$ being connected to the mid-point of the preceding bridge of row j=3 and the mid-point of the bridge considered applying an electric voltage $Vcc/2^2$ for j=2.

The successive bridges are of the same construction and therefore apply voltage values in a geometric progression of ½ for j=1, i.e. Vcc/8, and, for j=0, the voltage value Vcc/16. In effect, each successive divider bridge is connected to the mid-point of the divider bridge of adjacent rank so that the mid-point of each divider bridge of said rank j outputs an electric voltage of value $Vcc/2^{N-j}$ constituting the series of electric voltage values.

Furthermore, as illustrated in FIG. 1a, the programmable generator circuits 1 comprise a plurality, denoted by 11, of N circuits in series, N in this instance being equal to 4, each consisting of a resistor of a given value, which may of course be different from the value $R_0$ mentioned earlier in the description, and a switch denoted by $SW_0, SW_j \ldots, SW_{N-1}$, it being possible for these switches to be programmed to normally open or normally closed values respectively, depending on the value of one of the bits $b_0$ to $b_{N-1}$ making up the digital value to be converted.

Accordingly, as in the example illustrated in FIG. 1a although this is not restrictive, the least significant bit LSB, i.e. the bit $b_0$, is represented by the switch $SW_0$ and the most significant bit MSB, i.e. the bit $b_3$, is shown by the switch $SW_3$. The input terminal of each series circuit is connected to the mid-point of one of the successive divider bridges. In a preferred although not restrictive version, as illustrated in FIG. 1a, this connection is made via a separator amplifier, denoted by $A_0, \ldots, A_j$ to $A_3$, the purpose of this separator amplifier being to separate each series circuit from the successive divider bridges on which they are connected in order to prevent any harmful electrical interaction, the separator amplifiers $A_0$ having a very low output impedance and a very high input impedance to enable them to fulfill this separation function. Operation of these separator amplifiers will not be described in detail since their operating mode is known to the skilled person.

Accordingly, each series circuit receives an electric voltage of value $Vcc/2^{N-j}$ and outputs, depending on the position, closed or open, of the corresponding switch $Sw_j$ programmed by the corresponding bit $b_j$ of value 1 or 0 of the digital value to be converted, an elementary image electric current, denoted by $I_{ij}$, which is proportional to the voltage value $Vcc/2^{N-j}$. Accordingly, the value of each elementary image electric current $I_{ij}$ corresponds to an active value of the electric voltages in the series of electric voltages for a bit of value 1 and an elementary image electric current of zero value corresponds to a non-active value of the electric voltages in the series of electric voltages for a bit of zero value.

Under these conditions, each elementary image electric current $I_{ij}$ is proportional to said active value, which verifies equation (2) given earlier in the description.

Accordingly, as also illustrated in FIG. 1a, the output terminal of each of the signals constituting the plurality of series circuits is connected in parallel in order to output the image electric current $I_i$ mentioned above, being the sum of the elementary image currents $I_{ij}$. Consequently, the image electric current $I_i$ is proportional to the sum of the active values of said electric voltages.

In a preferred operating mode, although this is not restrictive, where the separator amplifiers $A_j$ have a gain 1, each elementary image electric current and hence the image electric current is proportional to the inverse of the resistor R constituting each series circuit.

As for the first programmable corrector circuits 2, and taking account of the value of the image electric current $I_i$ given above, they may also incorporate, as illustrated in FIG. 1a, an operational amplifier, denoted by 20, the negative input terminal of which is mounted as a virtual pseudo-ground terminal and receives the image electric current $I_i$ output by the programmable generator circuits 1. The output terminal of the operational amplifier 20 is connected in counter-reaction to said negative terminal via a plurality of N series circuits, each made up of a resistor R of a same value as the resistance of the serial circuits constituting the programmable generator circuits 1 and by a programmable switch providing a function similar to that of the switches $SW_0, SW_j$ to $SW_{N-j}=SW_3$ mentioned earlier in the description.

With reference to FIG. 1a, it should be pointed out that the group of N series circuits is connected in parallel to provide the aforementioned counter-reaction loop.

The positive input terminal of the operational amplifier 20 is in turn connected to a so-called shift voltage, which is preferably equal to half the supply voltage Vcc.

This being the case, when each of the programmable switches is in the closed or open position depending on the value of the bits $b_0$ to $b_{N-1}$ of the digital value to be converted, the output of the operational amplifier 20 applies the first programmed, corrected analogue voltage $V_A$. Depending on the structure and programming of said pluralities of series circuits, the weighted sum of the electric voltage active values is defined by a weighting term inversely proportional to the number of bits having value 1 in the digital value to be converted, as will be explained in more detail later in the description, although it should be pointed out that this is not restrictive.

As illustrated in FIG. 1a, the second corrector circuits 3, taking account of the value of the first programmed, corrected analogue voltage $V_A$, may advantageously incorporate an operational amplifier 30, the negative terminal of which is mounted as a virtual pseudo-ground terminal and receives the first programmed, corrected analogue voltage $V_A$ via a resistor of a given value equal to the value R mentioned above. The output of the operational amplifier 30 is connected in counter-reaction via a resistor of the same value to the negative terminal of this same operational amplifier 30. Furthermore, the positive terminal of the latter is connected to a shift voltage equal to half the supply voltage Vcc.

Under these conditions, the output of the operational amplifier 30 applies the second programmed, corrected analogue voltage $V_B$, from the first programmed, corrected analogue voltage $V_A$, substantially equal in value and sign to the weighted sum of the active values of the series of electric voltages.

The second programmed, corrected analogue voltage $V_B$ verifies the equation:

$$V_B = \frac{1}{K(\alpha)} \sum_{j=0}^{N-1} b_j \cdot V x_j$$

In this equation, $K(\alpha)$ is a weighting factor and denotes a function proportional to $\alpha$, whilst $\alpha$ denotes the number of bits equal to the value 1 of the digital value to be converted.

Finally, as illustrated in FIG. 1a, taking account of the value of the second programmed, corrected analogue voltage $V_B$, the third corrector circuits 4 may incorporate a gain-correcting operational amplifier 40, the negative terminal of which is connected to the reference voltage $V_{REF}$ via a plurality of N series circuits, each comprising a resistor of a same value, the value R, and by the programmable switches $SW_0$, $SW_j$ to $SW_3$ mentioned earlier in the description. The group of these N series circuits is connected in parallel, the output terminal of the operational amplifier being connected in counter-reaction to the negative terminal of the operational amplifier 40 via a resistor of a same value R. The positive terminal of the operational amplifier 40, connected to the output of the second corrector circuits 3, receives the second programmed, corrected analogue voltage $V_B$. Under these conditions, by applying an inverse gain of the weighting term, i.e. a gain in the form $K(\alpha)$, to the second programmed, corrected analogue voltage, the output of the operational amplifier 40 applies the output analogue voltage denoted by $V_{OUT}$, the value of which is therefore equal to the sum of the active values of electric voltages in the series of electric voltages.

Under these conditions, the analogue voltage verifies the equation:

$$V_{OUT} = \sum_{j=0}^{N-1} b_j \cdot V x_j$$

A first although not restrictive embodiment which is of particular advantage, enabling a specific value of the weighting factor $K(\alpha)$ to be obtained, will now be described in conjunction with FIG. 1a.

In this drawing, it may be seen that the last divider bridge enabling the last voltage value belonging to the series of voltages in ½ geometric progression to be generated is in fact followed by another divider bridge, value $R_0/R_0$, which in effect constitutes the termination of the series of divider bridges.

Under these conditions, on the basis of the last voltage value mentioned above, this final divider bridge enables another voltage value to be generated in a ratio of ½ relative to the preceding one and which therefore constitutes a value proportional to half the value of the weight of the least significant bit LSB. In the example illustrated in FIG. 1a, it will be recalled that if the image voltage value of the least significant bit LSB=Vcc/16, so that the voltage value output by the bridge $R_0/R_0$ becomes Vcc/32.

Accordingly, as illustrated in FIG. 1a, for a digital value to be converted which is coded on N bits, the image current $I_i$ advantageously contains a shift value denoted by $I_{id}$ proportional to half the value of the weight of the least significant bit. This value is introduced as a permanent active pseudo-value in order to shift the zero value of the analogue voltage obtained from a very low value, which may be rendered as low as the value of the supply voltage Vcc divided by the power of two of the number of bits +1 on which the digital value to be converted was coded.

To this end, each plurality of series circuits, both programmable generator circuits 1 and corrector circuits 2, additionally comprises a resistor, which may be permanent, of a same value R, connected directly in parallel on the group of corresponding series circuits. Clearly, in the case of series circuits of the plurality of series circuits 11 of the programmable generator circuits 1, the resistor, such as the permanent resistor R illustrated in FIG. 1a, is linked via a separator amplifier A to the mid-point of said terminating bridge $R_0/R_0$.

Under these conditions and taking account of the existence of this permanent resistor, the weighting term $K(\alpha)$ is then inversely proportional to the number of bits with value 1 in the digital value to be converted incremented by 1. The same is true of the gain term applied by the corrector circuits 3 if $K(\alpha)=\alpha+1$.

A theoretical justification of the embodiment described above will now be given, also with reference to FIG. 1a.

By applying the law of nodes at the negative input of the operational amplifier 20, which is mounted as a virtual pseudo-ground, the equation of currents is written as follows:

$$\frac{\sum_{j=0}^{N-1} \left( V x_j - \frac{V cc}{2} \right)}{R} = \frac{\frac{V cc}{2} - V_A}{R/(\alpha+1)} \qquad \text{Equation 3}$$

In the equation given above, the term $(\alpha+1)$ is introduced due to the fact that there are a bits of value 1 and a permanent resistor R in the plurality of series circuits 11 and 21 mentioned earlier in the description.

Developing and simplifying equation 3 leads to equation 4, expressed as follows:

$$\sum_{j=0}^{N-1}\left(Vx_j - (\alpha+1)\frac{Vcc}{2}\right) = (\alpha+1)\frac{Vcc}{2} - (\alpha+1)V_A \quad \text{Equation 4}$$

The solution of this latter equation expresses the first programmed, corrected analogue voltage VA in accordance with equation 5:

$$V_A = Vcc - \sum_{j=0}^{N-1} \frac{Vx_j}{(\alpha+1)} \quad \text{Equation 5}$$

The weighting term is therefore $K(\alpha)=1/\alpha+1$.

Similarly, the written expression of the law of nodes at the negative input of the operational amplifier 30 of the second corrector circuits 3 enables equation 6 to be written as follows:

$$\frac{V_A - Vcc/2}{R} = \frac{Vcc/2 - V_B}{R} \quad \text{Equation 6}$$

The expression of the second programmed, corrected analogue voltage $V_B$ is then written as follows:

$$V_B = Vcc - V_A = \frac{1}{\alpha+1}\sum_{j=0}^{N-1} Vx_j \quad \text{Equation 7}$$

The weighting term then takes the form $1/K(\alpha)-1/\alpha+1$.

Finally, the written expression of the law of nodes at the negative input of the operational amplifier 40 enables equation 8 to be expressed as follows:

$$\frac{V_B}{R/\alpha} = \frac{V_{OUT}}{R + R/\alpha} \quad \text{Equation 8}$$

which, once the form $V_{OUT}/V_B=\alpha+1$ has been resolved, enables equation 9 to be expressed as follows:

$$V_{OUT} = \sum_{j=0}^{N-1} Vx_j \quad \text{Equation 9}$$

The device proposed by the present invention and described above therefore enables an analogue voltage to be obtained which is equal to the sum of the active values $Vx_j$ of electric voltages in the series of said electric voltages.

Going back to equation (2) given earlier in the description, each active voltage $Vx_j$ with a zero value for $b_j$ bits in the digital value to be converted equals zero and the value $Vcc/2^{N-j}$ for $b_j=1$.

The embodiment described above with reference to FIG. 1a is entirely satisfactory. However, this embodiment is not restrictive.

In practice, it is possible to make the shift value in the analogue voltage relative to the value 0 as low as half the value of the analogue voltage representative of the least significant bit.

In effect, introducing the shift value via the permanent resistors of value R illustrated in FIG. 1a may be seen as tantamount to introducing a pseudo-bit of value 1, not relative to the coded digital value to be converted but relative to the value of the analogue voltage finally obtained.

Figure 1B:
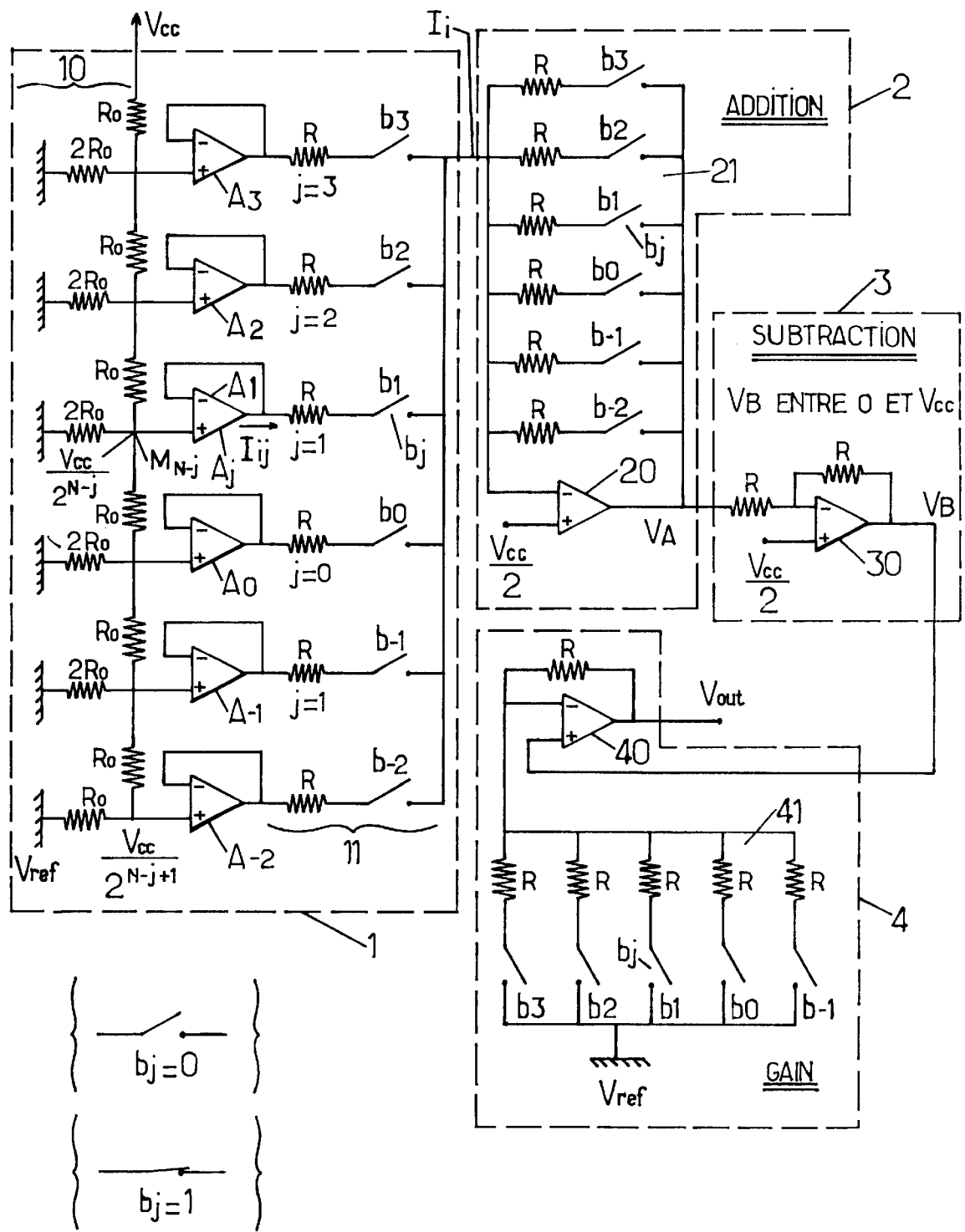
FIG. 1b illustrates a second example, which is not restrictive in any respect, of the digital-to-analogue converter proposed by the present invention.

This being the case, a preferred embodiment as illustrated in FIG. 1b may consist in adding a pseudo-bit or fictitious bit of rank $j=-1$ in FIG. 1b on all the pluralities of series circuits introduced, that is to say at the level of the pluralities of serial circuits 11, 21 and 41 illustrated in FIG. 1a.

Moreover, and this is not restrictive, for the plurality of series circuits 11 and 21 of the programmable generator circuits 1 and the first corrector circuits 2, a permanent resistor R may be added or, as is the case, a pseudo-bit, denoted by $b_{-3}$.

Under these conditions, as illustrated in FIG. 1b, transcoding at the zero value of the pseudo-bit $b_{-1}$ enables operation similar to that illustrated in FIG. 1a but where the voltage shift value of the analogue voltage is no longer equal to half the value of the least significant bit but a quarter, By contrast, of the permanent resistor R illustrated in FIG. 1b is connected via a switch controlled by a pseudo-bit $b_{-2}$, the digital-to-analogue converter proposed by the present invention enables operation over a variable number of bits, it being possible for the number of bits to be brought to a value of N+2, the pseudo-bits $b_{-1}$ and $b_{-2}$ effectively being used to convert a value coded on N+1 bits. Clearly, there is no limit to the number of series circuits in the plurality, either in the programmable generator circuits 1 or in the corrector circuits 2.

Finally, the value of the converted analogue voltage is between the value of the supply voltage Vcc and the reference voltage, being ground voltage. In particular, the value of the converted analogue voltage will reach the value Vcc if all the bits $b_0$ to $b_{N-1}=1$, this value converging towards the value Vcc by a value lower than any value other than the image analogue voltage value of the least significant bit. For this reason, it is also possible to supply the plurality of resistive bridges from a supply voltage adapted so as to be higher than the supply voltage Vcc in order to obtain a range of variation in converted values between the reference voltage or ground voltage, and a standardised voltage such as a supply voltage of the integrated circuit, for example.

What is claimed is:

1. An instantaneously acting digital-to-analogue converter receiving a digital value, coded on N bits, to be converted into an analogue voltage having a value ranging between an electric supply voltage Vcc and a reference voltage, ground voltage, wherein said digital-to-analogue converter comprises at least:

programmable means for generating an image electric current proportional to the sum of the active values of electric voltages in a series of N electric voltages constituting a ½ geometric progression and forming an analogue image of the weight of the bits between the most significant bit and the least significant bit on which said digital value to be converted is coded, said active values corresponding to said electric voltages in this series of values for which the analogue image of the weight of bits of said digital value to be converted corresponds to a bit of value 1;

first programmable corrector means receiving said image electric current and enabling a first programmed, corrected analogue voltage to be generated, proportional to the difference between said supply voltage Vcc and the weighted sum of said active values of electric voltages in the series of electric voltages, the weighting term of said weighted sum being inversely proportional to the number of bits of value 1 of said digital value to be converted;

second corrector means receiving said first programmed, corrected analogue voltage and enabling a second programmed, corrected analogue voltage to be generated, substantially equal in value and sign to said weighted sum of said active values of electric voltages in said series of electric voltages;

third corrector means receiving said second programmed, corrected analogue voltage and enabling a programmed gain to be applied, equal to the inverse of said weighting term, which enables said analogue voltage with a value ranging between said supply voltage and said reference voltage to be generated, said value being equal to the sum of said active values of electric voltages in said series of electric voltages.

2. The digital-to-analogue converter as claimed in claim 1, wherein said programmable means for generating an image current proportional to the sum of the active values of electric voltages comprise at least:

a plurality of N electric voltage divider bridges $R_0/2R_0$ connected in a cascade arrangement between said supply voltage and said reference voltage, $R_0$ denoting a given resistance value, the input terminal of the first divider bridge being connected to the supply voltage Vcc and the input terminal of each successive divider bridge being connected to the mid-point of the divider bridge of adjacent rank, the mid-point of each divider bridge of rank j outputting an electric voltage of value $Vcc/2^{N-j}$ constituting the series of electric voltage values;

a plurality of N series circuits, each formed by a resistor of a given value and a programmable switch ($b_0$, $b_j$ to $b_3$), the input terminal of each series circuit being connected to the mid-point of a divider bridge and receiving an electric voltage of value $Vcc/2^{N-j}$, each series circuit, depending on whether this switch is programmed to a closed or open position by a bit of value 1 or 0 of said digital value to be converted, outputting an elementary image electric current $I_{ij}$ proportional to said value $Vcc/2^{N-j}$, corresponding to an active value of the electric voltages of said series of electric voltages for a bit of value 1 and an elementary image electric current of zero value, corresponding to a non-active value of the electric voltages in the series of electric voltages for a bit of value 0, the output terminal of said plurality of series circuits being connected in parallel in order to output said image electric current $I_i$, being the sum of the elementary image currents $I_{ij}$, proportional to the sum of said active values of electric voltages.

3. The digital-to-analogue converter as claimed in claim 1, wherein said first programmable corrector means incorporate an operational amplifier, the negative input terminal of which, mounted as a virtual pseudo-ground terminal, receives said image electric current $I_i$ output by said programmable generator means, the output terminal of said operational amplifier being connected in counter-reaction to said negative terminal via a plurality of N series circuits, each made up of a resistor of a same value and a programmable switch, the group of N serial circuits being connected in parallel, the positive input terminal of said operational amplifier being connected to a shift voltage, equal to half the supply voltage, the output of said operational amplifier outputting, when each of the programmable switches is programmed to a closed or open position depending on the value of the bits of said digital value to be converted, said first programmed, corrected analogue voltage $V_A$.

4. The digital-to-analogue converter as claimed in claim 1, wherein said second corrector means incorporate an operational amplifier, the negative terminal of which, mounted as a virtual pseudo-ground terminal, receives said first programmed, corrected analogue voltage $V_A$ via a resistor of a given value, the output of said operational amplifier being connected in counter-reaction via a resistor of a same value to said negative terminal, the positive terminal of said operational amplifier being connected to a shift voltage equal to half the supply voltage, the output of said operational amplifier outputting said second programmed, corrected analogue voltage $V_B$ substantially equal in value and sign to said weighted sum of said active values of said series of electric voltages.

5. The digital-to-analogue converter as claimed in claim 1, wherein said third corrector means incorporate a gain-correcting operational amplifier, the negative terminal of which is connected to said reference voltage, ground voltage, via a plurality of N series circuits each formed by a resistor of a same value and a programmable switch, the group of N series circuits being connected in parallel, the output terminal of said operational amplifier being connected in counter-reaction to said negative terminal by a resistor of a same value, the positive terminal of said operational amplifier being connected to the output of said second corrector means and receiving said second programmed corrected analogue voltage $V_B$, the output of said operational amplifier applying an inverse gain of the weighting term to said second programmed, corrected analogue voltage in order to output said analogue voltage $V_{OUT}$ having a value equal to the sum of said active values of electric voltages in said series of electric voltages.

6. The digital-to-analogue converter as claimed in claim 1, wherein, for a digital value to be converted, coded on N bits, said image current $I_i$ contains a shift value proportional to half the value of the weight of the least significant bit, this value being introduced as a permanent active pseudo-value, each plurality of series circuits of the programmable generator means and first corrector means additionally having a permanent resistor of a same value connected directly in parallel on the group of series circuits, the weighting term being inversely proportional to the number of bits of value 1 of said digital value to be converted incremented by 1 and the gain term being proportional to the number of bits of value 1 incremented by 1 of said digital value to be converted.

* * * * *